United States Patent
Zhang et al.

(10) Patent No.: US 8,552,435 B2
(45) Date of Patent: Oct. 8, 2013

(54) ELECTRONIC DEVICE STRUCTURE INCLUDING A BUFFER LAYER ON A BASE LAYER

(75) Inventors: Qingchun Zhang, Cary, NC (US); Anant Agarwal, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 87 days.

(21) Appl. No.: 12/840,583

(22) Filed: Jul. 21, 2010

(65) Prior Publication Data

US 2012/0018737 A1    Jan. 26, 2012

(51) Int. Cl.
*H01L 29/15* (2006.01)

(52) U.S. Cl.
USPC ...... 257/77; 257/147; 257/E29.212; 438/105; 438/931

(58) Field of Classification Search
USPC .......................................................... 257/77
See application file for complete search history.

(56) References Cited

U.S. PATENT DOCUMENTS

| | | | |
|---|---|---|---|
| 5,242,839 A | 9/1993 | Oh et al. | |
| 5,753,960 A | 5/1998 | Dickmann | |
| 6,194,290 B1 | 2/2001 | Kub et al. | |
| 7,838,377 B2 | 11/2010 | Zhang et al. | |
| 2005/0045982 A1 | 3/2005 | Shenai | |
| 2008/0124931 A1* | 5/2008 | Lee et al. | 438/692 |

FOREIGN PATENT DOCUMENTS

| | | |
|---|---|---|
| EP | 2154723 A2 | 2/2010 |
| JP | 2010045363 A * | 2/2010 |

OTHER PUBLICATIONS

International Search Report for PCT/US2011/039343, mailed Sep. 7, 2011.

* cited by examiner

*Primary Examiner* — Ajay K Arora
(74) *Attorney, Agent, or Firm* — Withrow & Terranova, P.L.L.C.

(57) ABSTRACT

Electronic device structures that compensate for non-uniform etching on a semiconductor wafer and methods of fabricating the same are disclosed. In one embodiment, the electronic device includes a number of layers including a semiconductor base layer of a first doping type formed of a desired semiconductor material, a semiconductor buffer layer on the base layer that is also formed of the desired semiconductor material, and one or more contact layers of a second doping type on the buffer layer. The one or more contact layers are etched to form a second contact region of the electronic device. The buffer layer reduces damage to the semiconductor base layer during fabrication of the electronic device. Preferably, a thickness of the semiconductor buffer layer is selected to compensate for over-etching due to non-uniform etching on a semiconductor wafer on which the electronic device is fabricated.

40 Claims, 17 Drawing Sheets

CENTER

EDGE

US 8,552,435 B2

ELECTRONIC DEVICE STRUCTURE INCLUDING A BUFFER LAYER ON A BASE LAYER

This invention was made with government funds under Contract No. W911NF-04-2-0022 given by Army Research Labs. The U.S. Government may have rights in this invention.

FIELD OF THE DISCLOSURE

The present disclosure relates to an electronic device structure that includes a buffer layer to compensate for non-uniform etching over a semiconductor wafer and to protect the semiconductor surface of the electronic device.

BACKGROUND

Silicon Carbide (SiC) Gate Turn-Off Thyristors (GTOs) are considered to be an appropriate device for high power, high temperature, and high frequency applications. One of the major challenges in the fabrication of SiC GTOs is the phenomenon of current gain instability on the top transistor, which is partially attributed to surface recombination. More specifically, FIGS. 1A through 1C illustrate a conventional process for fabricating a GTO 10. As illustrated in FIG. 1A, fabrication of the GTO 10 begins with a structure 12 including a number of semiconductor layers 14 through 22 of a desired semiconductor material having alternating doping types. The semiconductor layers 14 through 22 are eptiaxially grown layers of the desired semiconductor material. More specifically, the structure 12 includes an N-type semiconductor layer 14 that is highly doped, a P-type semiconductor layer 16 on the N-type semiconductor layer 14, an N-type base layer 18 epitaxially grown on the P-type semiconductor layer 16, a P-type semiconductor layer 20 that is highly doped and on the N-type base layer 18, and a P-type semiconductor layer 22 that is very highly doped and on the P-type semiconductor layer 20.

As illustrated in FIG. 1B, the P-type semiconductor layers 20 and 22 are etched down to the N-type base layer 18 such that, after etching, the P-type semiconductor layers 20 and 22 form an anode of the GTO 10. The bottom surface of the N-type semiconductor layer 14 forms a cathode of the GTO 10. As illustrated, as a result of the etching process, there is substantial damage to the crystalline structure both at sidewall surfaces 24 of the P-type semiconductor layers 20 and 22 forming the anode of the GTO 10 and at a surface 26 of the N-type base layer 18. Lastly, as illustrated in FIG. 1C, N+ wells 28 are formed in the N-type base layer 18 as illustrated via ion implantation. The N+ wells 28 form gates of the GTO 10. At this point, fabrication of the GTO 10 is complete.

During operation, when a current ($I_G$) is applied to the gates, electrons are injected into the N-type base layer 18 and travel through the N-type base layer 18 into the P-type semiconductor layers 20 and 22 forming the anode of the GTO 10. These electrons attract holes from the P-type semiconductor layers 20 and 22 forming the anode. Because the P-type semiconductor layers 20 and 22 are highly doped, a single electron injected into the N-type base layer 18 attracts multiple holes from the P-type semiconductor layers 20 and 22. As a result, holes that are attracted by the electrons injected into the N-type base layer 18 that do not combine with the electrons injected into the N-type base layer 18 flow from the anode of the GTO 10 to the cathode of the GTO 10, thereby creating a current flowing through the GTO 10.

However, the damage to the crystalline structure due to the etching process to form the anode of the GTO 10 results in interface charge, or surface traps, both at the sidewall surfaces 24 of the P-type semiconductor layers 20 and 22 and the surface 26 of the N-type base layer 18. This interface charge attracts and traps electrons injected into the N-type base layer 18 in a phenomenon referred to as surface recombination. This surface recombination decreases a gain ($\beta$) of a top transistor of the GTO 10. The top transistor of the GTO 10 is a PNP transistor formed by the semiconductor layers 16, 18, and 20. The GTO 10 also includes a bottom transistor, which is an NPN transistor formed by the semiconductor layers 14, 16, and 18. By decreasing the gain ($\beta$) of the top transistor of the GTO 10, surface recombination also increases a turn-on current ($I_{G,TURN-ON}$) required at the gate of the GTO 10 in order to turn on the GTO 10. Further, during operation, the amount of interface charge, or surface traps, increases, thereby resulting in instability in a current gain of the GTO 10 and thus the turn-on current ($I_{G,TURN-ON}$) of the GTO 10. In addition, surface recombination increases an on-resistance of the GTO 10. As such, there is a need for a GTO structure that eliminates or at least mitigates surface recombination.

Another issue that arises during fabrication is less than ideal yield due to non-uniform etching. More specifically, as illustrated in FIG. 2, a number of GTOs 10 are fabricated on a semiconductor wafer 30. However, when etching the P-type semiconductor layers 20 and 22 via Reactive Ion Etching (RIE) or a similar etching process to form the anodes of the GTOs 10, etching occurs faster near the outside of the semiconductor wafer 30 than at the center of the semiconductor wafer 30, which results in over-etching of the GTOs 10 near the outside of the semiconductor wafer 30 into the N-type base layers 18 of those GTOs 10, as illustrated in FIG. 3. As a result of the over-etching, the GTOs 10 in an outside area 32 (FIG. 2) of the semiconductor wafer 30 fail to operate as intended, which reduces yield. For example, due to over-etching, only 60%-70% of the GTOs 10 fabricated on the semiconductor wafer 30 may be usable (i.e., the yield may be only 60%-70%). As such, there is a need for an electronic device structure that increases yield and a method of fabricating the same.

SUMMARY

Electronic device structures that compensate for non-uniform etching on a semiconductor wafer and methods of fabricating the same are disclosed. In general, the electronic device structures are provided for a PN junction based electronic device such as, but not limited to, a Gate Turn-Off Thyristor (GTO), a Bipolar Junction Transistor (BJT), or a MOS-Controlled Thyristor (MCT). In one embodiment, the electronic device includes a number of layers. The semiconductor layers include a semiconductor base layer of a first doping type formed of a desired semiconductor material, a semiconductor buffer layer on the semiconductor base layer that is also formed of the desired semiconductor material, and one or more contact layers of a second doping type on the buffer layer. The one or more contact layers are etched to form a second contact region of the electronic device. The buffer layer reduces damage to the semiconductor base layer during fabrication of the electronic device.

Preferably, a thickness of the semiconductor buffer layer is selected to compensate for over-etching when etching the one or more contact layers to form the second contact region due to non-uniform etching on a semiconductor wafer on which the electronic device is fabricated. In one embodiment, the thickness of the semiconductor buffer layer is greater than or equal to a maximum amount of over-etch on the semiconductor wafer when etching the one or more contact layers to form the second contact region due to non-uniformity of etching on the semiconductor wafer. In one embodiment, the semiconductor buffer layer is lightly doped and of the second doping type. In another embodiment, the semiconductor buffer layer is lightly doped and of the first doping type, and the electronic device further includes a semiconductor ledge layer formed of the semiconductor material that is lightly doped and of the second doping type.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 1A through 1C illustrate a Gate Turn-On Thyristor (GTO) and a method of fabrication thereof according to the prior art;

FIG. 2 graphically illustrates non-uniform etching on a semiconductor wafer on which a number of the GTOs of FIGS. 1A through 1C are formed according to the prior art;

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Electronic device structures that compensate for non-uniform etching on a semiconductor wafer and methods of manufacturing the same are disclosed. In general, electronic device structures are provided for a PN junction based electronic device. For the discussion below, the PN junction based electronic device is primarily a Gate Turn-Off Thyristor (GTO). However, the inventive concepts disclosed herein are not limited thereto. The inventive concepts disclosed herein are equally applicable to other types of PN junction based electronic devices such as, for example, Bipolar Junction Transistors (BJTs), MOS-Controlled Thyristors (MCTs), or the like.

Figure 4A:
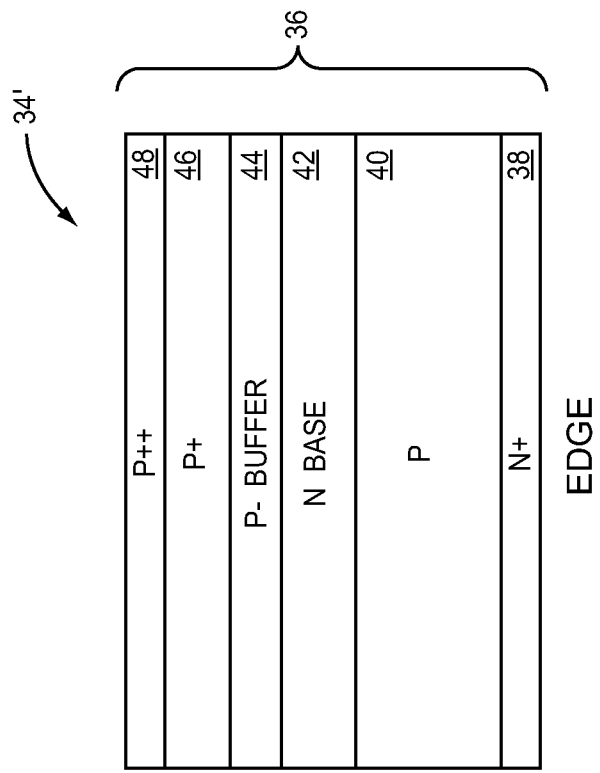
FIGS. 4A through 4C illustrate a P-type GTO including a buffer layer and a method of fabrication thereof according to a first embodiment of the present disclosure.
Figure 4A:
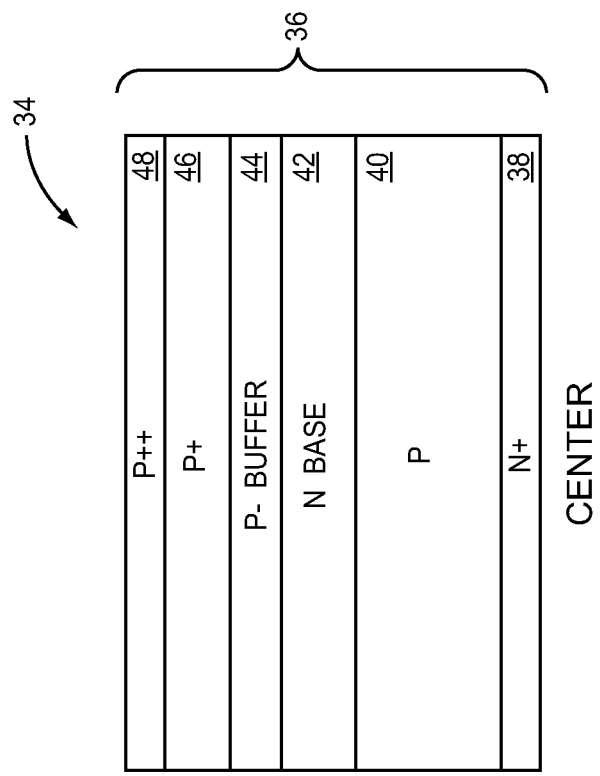
Figure 4B:
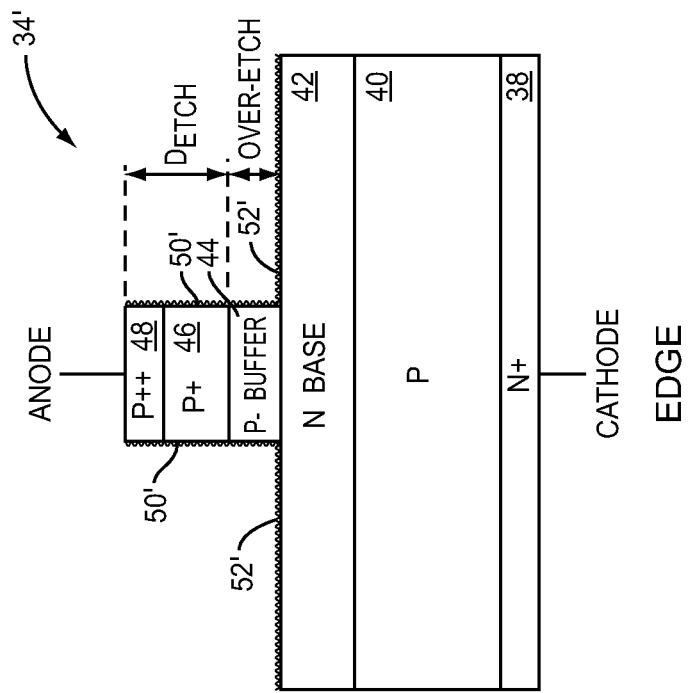
Figure 4B:
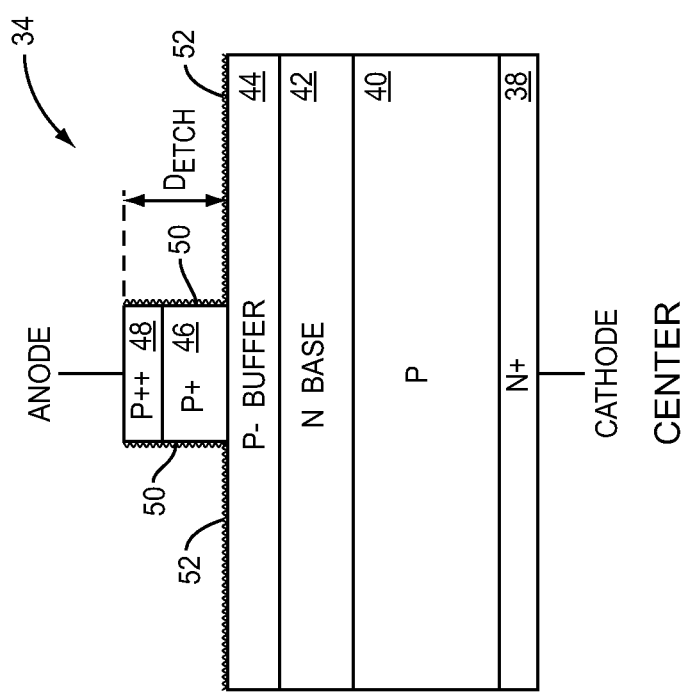
Figure 4C:
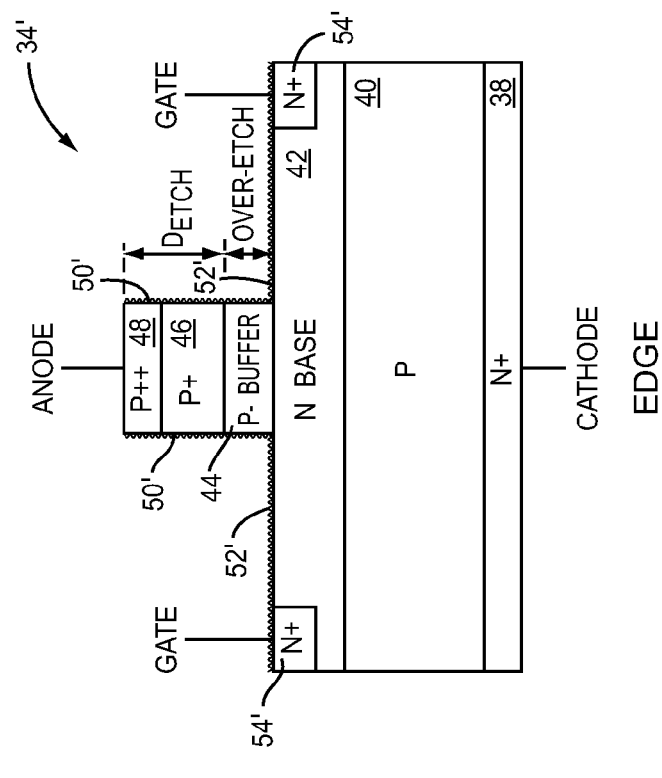
Figure 4C:
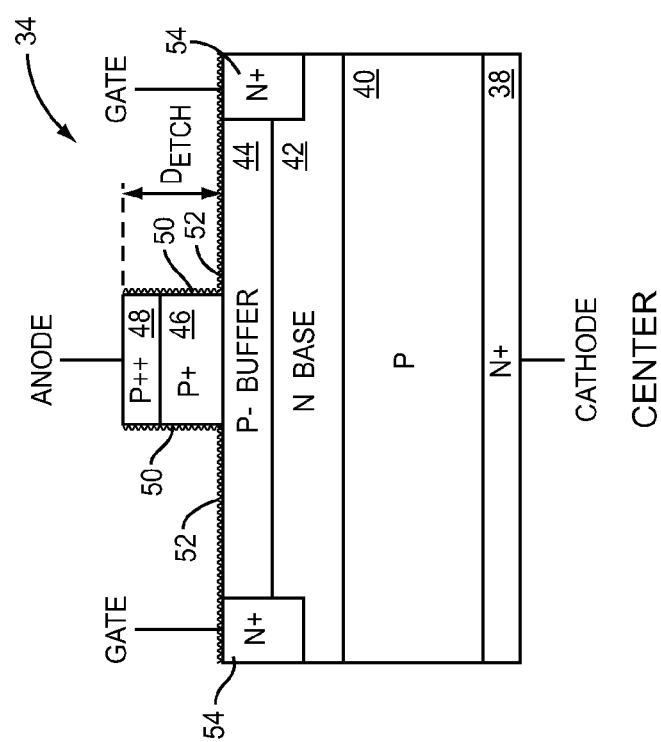

FIGS. 4A through 4C illustrate GTOs 34 and 34' fabricated near a center of a semiconductor wafer and near an outer edge of the semiconductor wafer, respectively, according to one embodiment of the present disclosure. As illustrated, fabrication of both the GTO 34 fabricated near the center of the semiconductor wafer and the GTO 34' fabricated near the outer edge of the semiconductor wafer begins with a structure 36 including a number of semiconductor layers 38 through 48 of a desired semiconductor material. The semiconductor layers 38 through 48 are preferably epitaxially grown layers of the desired semiconductor material. In the preferred embodiment, the semiconductor layers 38 through 48 are Silicon Carbide (SiC). However, the present disclosure is not limited thereto. Other semiconductor materials may be used as will be appreciated by one of ordinary skill in the art upon reading this disclosure.

The structure 36 includes an N-type semiconductor layer 38 that is highly doped, a P-type semiconductor layer 40 on the N-type semiconductor layer 38, an N-type base layer 42 epitaxially grown on the P-type semiconductor layer 40, a P-type buffer layer 44 epitaxially grown on the N-type base layer 42 and that is lightly doped, a P-type semiconductor layer 46 on the P-type buffer layer 44 and that is highly doped, and a P-type semiconductor layer 48 on the P-type semiconductor layer 46 and that is very highly doped. The P-type semiconductor layers 46 and 48 may also be referred to herein as contact layers. Note that, while not illustrated, one of ordinary skill in the art will readily appreciate that one or more of the semiconductor layers 38 through 48 may include sub-layers. For example, the P-type semiconductor layer 40 may include a P-type sub-layer (e.g., an isolation layer) on the N-type semiconductor layer 38 and a lightly doped P-type sub-layer (e.g., a drift layer) on the P-type sub-layer. As used herein, unless otherwise stated, a highly doped semiconductor layer has a doping level of greater than or equal to about $1\times10^{18}$ carriers (i.e., electrons or holes) per centimeter cubed ($cm^3$), a very highly doped semiconductor layer has a doping level in a range of about and including $5\times10^{18}$ to $2\times10^{20}$ carriers per $cm^3$, and a lightly doped semiconductor layer has a doping level of less than or equal to about $1\times10^{17}$ carriers per $cm^3$.

As illustrated in FIG. 4B, the P-type semiconductor layers 46 and 48 are etched such that, after etching, the P-type semiconductor layers 46 and 48 form anodes of the GTOs 34 and 34'. Note that the N-type semiconductor layer 38 forms cathodes of the GTOs 34 and 34'. In one embodiment, the P-type semiconductor layers 46 and 48 are etched via Reactive Ion Etching (RIE). For the GTO 34 fabricated near the center of the semiconductor wafer, the P-type semiconductor layers 46 and 48 are etched to a desired etching depth ($D_{ETCH}$). However, due to non-uniform etching across the semiconductor wafer, etching near the outer edge of the semiconductor wafer is faster than etching near the center of the semiconductor wafer. As a result, over-etching occurs for the GTO 34' fabricated near the outer edge of the semiconductor wafer. An amount of over-etch (OVER-ETCH) is a function of both the type of etching (e.g., RIE) and a position of the GTO 34' on the semiconductor wafer. For this discussion, the GTO 34' is fabricated at a position on the semiconductor wafer having a maximum amount of over-etch.

In this embodiment, a thickness of the P-type buffer layer 44 is equal to, or at least approximately equal to, the maximum amount of over-etch. As an example, if the maximum amount of over-etch is 20% of the desired etching depth ($D_{ETCH}$), then the thickness of the P-type buffer layer 44 may be $0.2 \times D_{ETCH}$. Thus, as a more specific example, if the desired etching depth ($D_{ETCH}$) is 1.5 microns, then the thickness of the P-type buffer layer 44 may be 0.3 microns or approximately 0.3 microns. It should be noted that while in this example the thickness of the P-type buffer layer 44 is equal to, or at least approximately equal to, the maximum amount of over-etch, the present disclosure is not limited thereto. More specifically, in another embodiment, the thickness of the P-type buffer layer 44 may be the maximum amount of over-etch minus a predetermined acceptable amount of over-etch into the N-type base layer 42. The acceptable amount of over-etch into the N-type base layer 42 is an amount of over-etch that can occur without the GTO 34' failing to operate as intended. In one embodiment, the doping level of the P-type buffer layer 44 is in a range of about and including $1 \times 10^{16}$ and $1 \times 10^{17}$ carriers per $cm^3$, and the thickness of the P-type buffer layer 44 is in a range of about and including 0.1 to 0.3 microns. In contrast, in one embodiment, a doping level of the N-type base layer 42 is in a range of about and including $1 \times 10^{17}$ and $1 \times 10^{18}$ carriers per $cm^3$, and a thickness of the N-type base layer 42 in a range of about and including 0.5 to 5 microns.

Figure 1A:
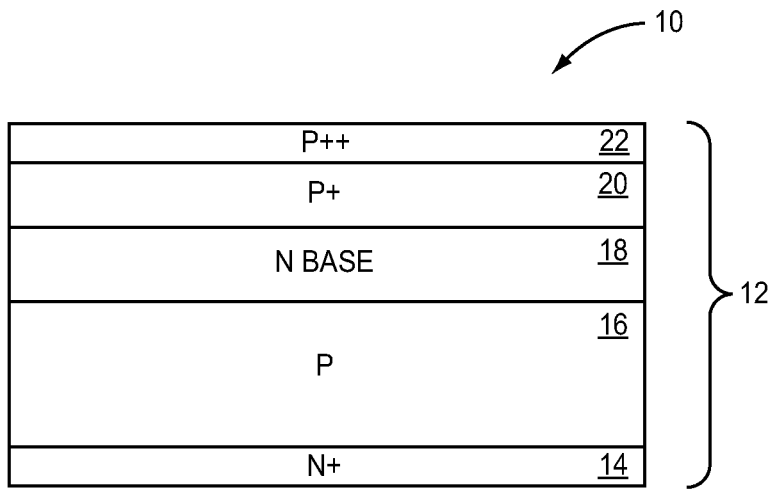
Figure 1B:
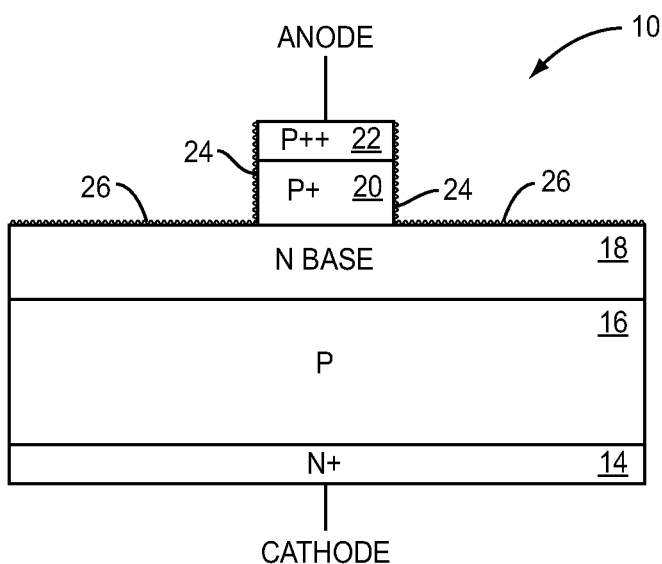
Figure 1C:
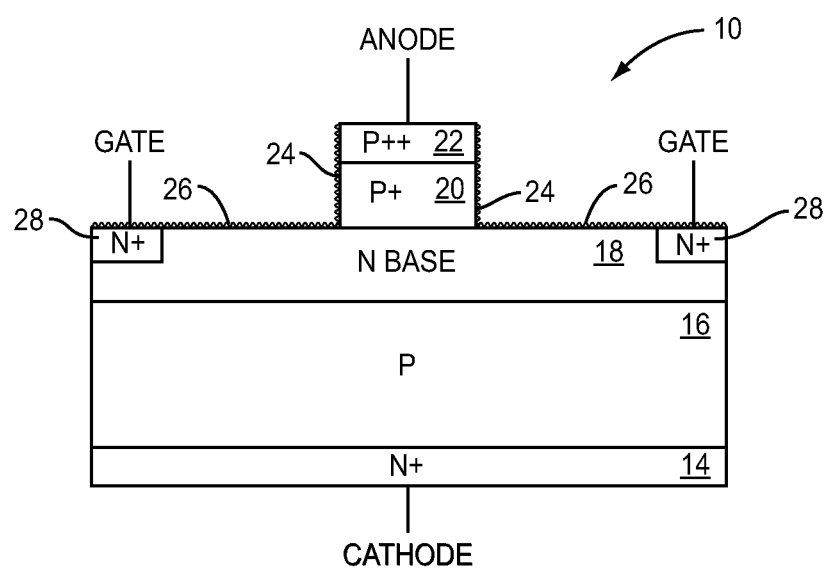
Figure 2:
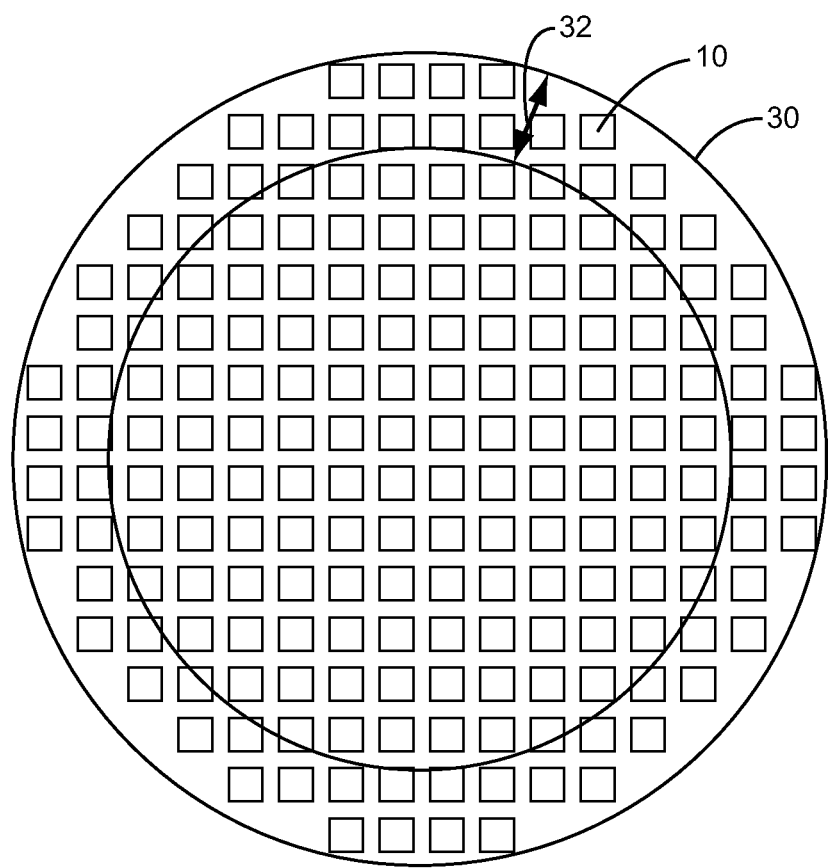
Figure 3:
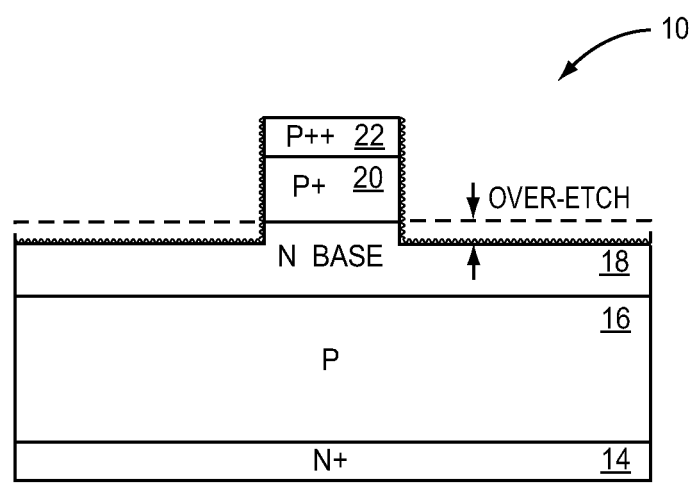
FIG. 3 illustrates over-etching into the base layer of the GTO as a result of non-uniform etching on the semiconductor wafer on which the GTO is formed according to the prior art.

In addition to compensating for the non-uniform etching on the semiconductor wafer, the P-type buffer layer 44 also mitigates or eliminates surface recombination particularly for the GTO 34 fabricated near the center of the semiconductor wafer. More specifically, as illustrated in FIG. 4B, as a result of the etching process, there is substantial damage to the crystalline structure both at sidewall surfaces 50 of the P-type semiconductor layers 46 and 48 forming the anode of the GTO 34 and a surface 52 of the P-type buffer layer 44. Likewise, for the GTO 34', there is substantial damage to the crystalline structure both at: (1) sidewall surfaces 50' of the P-type semiconductor layers 46 and 48 forming the anode of the GTO 34' and the P-type buffer layer 44 due to over-etching and (2) a surface 52' of the N-type base layer 42. The damage to the crystalline structure at the sidewall surfaces 50 and 50' and the surfaces 52 and 52' of the GTOs 34 and 34' results in interface charge, or surface traps, at those surfaces 50, 50', 52, and 52'. For the GTO 34 fabricated near the center of the semiconductor wafer, the P-type buffer layer 44 moves the interface charge at the surface 52 away from the N-type base layer 42. As a result, surface recombination is reduced (i.e., the number of electrons injected into the N-type base layer 42 that are trapped by the interface charge is reduced as compared to that of the traditional GTO 10 (FIGS. 1A through 1C) where the interface charge is directly on the surface of the N-type base layer 18). The reduction in surface recombination increases the gain ($\beta$) of the top transistor of the GTO 34 as compared to that of the traditional GTO 10, which in turn decreases the turn-on current ($I_{G,TURN-ON}$) of the GTO 34 as compared to that of the traditional GTO 10.

Next, as illustrated in FIG. 4C, N+ wells 54 and 54' are formed in the N-type base layer 42 of the GTOs 34 and 34', respectively, via ion implantation, where the N+ wells 54 and 54' form gates of the GTOs 34 and 34'. The N+ wells 54 of the GTO 34 extend through the P-type buffer layer 44 into the N-type base layer 42. Because the P-type buffer layer 44 is lightly doped, the P-type buffer layer 44 has a high resistivity such that the anode and gates of the GTO 34 are not shorted. Note that while the GTOs 34 and 34' of this embodiment include two N+ wells 54 and 54' and thus two gates, the GTOs 34 and 34' may alternatively include only one N+ well 54 and 54' and one gate. It should also be noted that the anode, cathode, and gate(s) of the GTOs 34 and 34' may more generally be referred to herein as contact regions. While not shown, a passivation layer may optionally be formed over the sidewall surfaces 50 and 50' and the surfaces 52 and 52' of the GTOs 34 and 34'. The passivation layer may be Silicon Dioxide ($SiO_2$), Silicon Nitride (SiN), or other suitable material.

Figure 5:
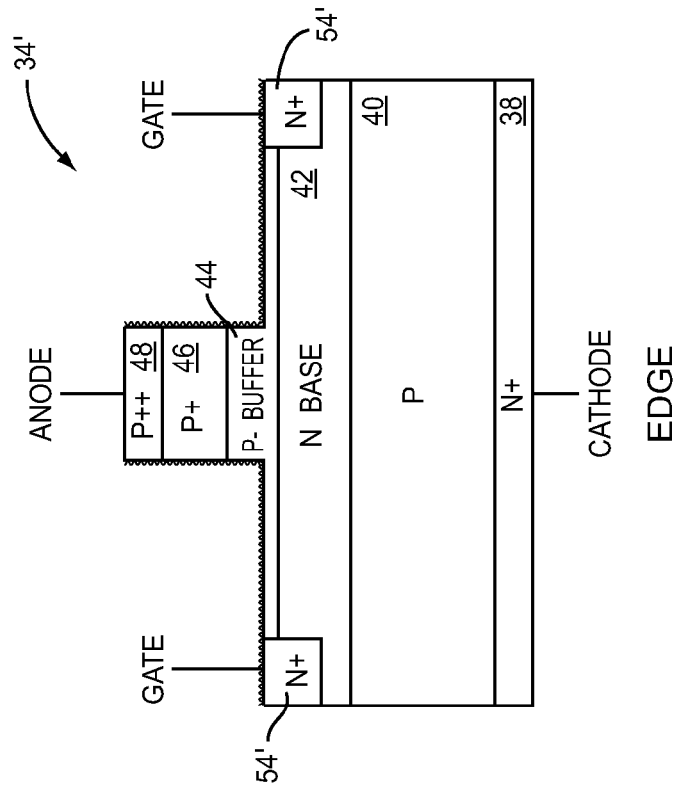
FIG. 5 illustrates a P-type GTO including a buffer layer according to a second embodiment of the present disclosure.
Figure 5:
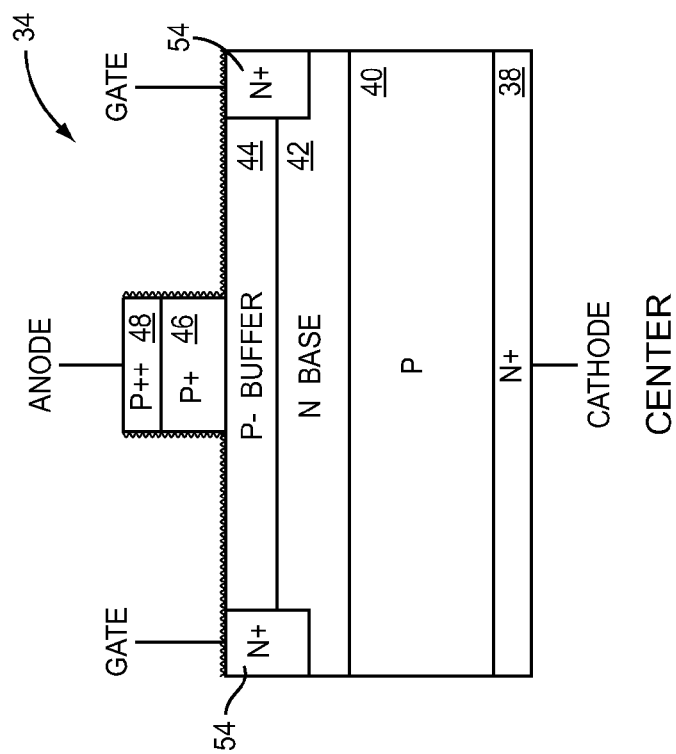

FIG. 5 illustrates the GTOs 34 and 34' of FIGS. 4A through 4C according to another embodiment of the present disclosure. In this embodiment, the thickness of the P-type buffer layer 44 is greater than the maximum amount of over-etch. As a result, a portion of the P-type buffer layer 44 remains on the surface of the N-type base layer 42 even for the GTO 34' that experiences the maximum amount of over-etch. By doing so, the interface charge resulting from the damage to the crystalline structure during etching of the P-type semiconductor layers 46 and 48 to form the anode of the GTO 34' is at the surface of the remaining portion of the P-type buffer layer 44 and therefore is moved away from the N-type base layer 42. Thus, in this embodiment, the P-type buffer layer 44 reduces surface recombination for both the GTO 34 fabricated near the center of the semiconductor wafer and the GTO 34' fabricated near the outer edge of the semiconductor wafer.

Figure 6:
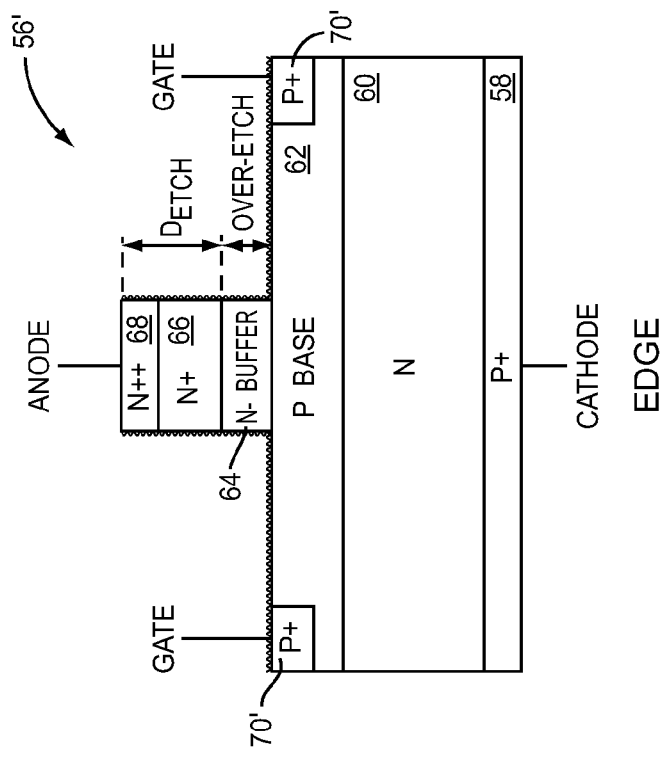
FIG. 6 illustrates an N-type GTO including a buffer layer according to the first embodiment of the present disclosure.
Figure 6:
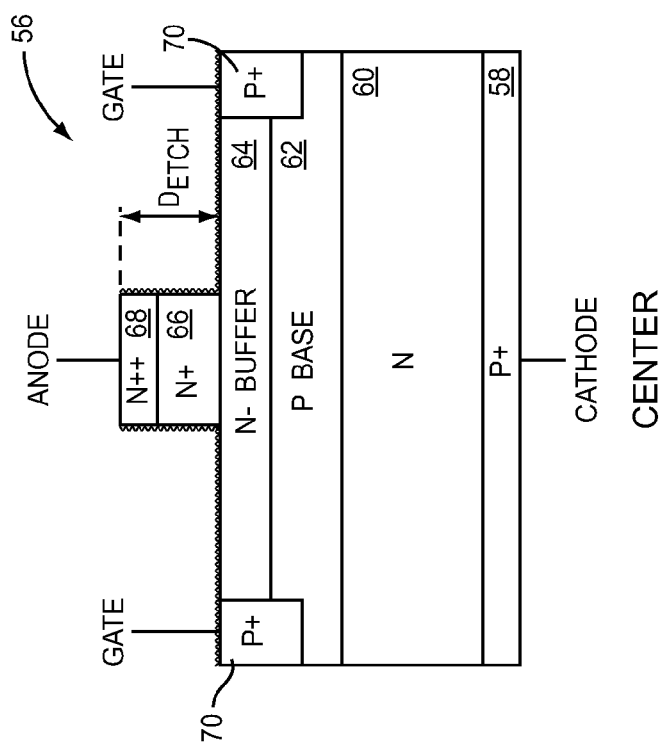
Figure 7:
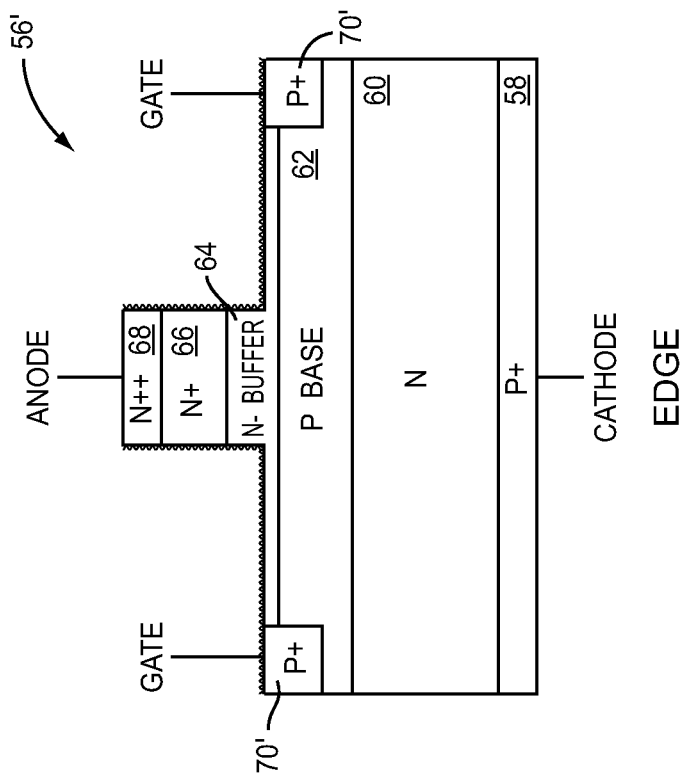
FIG. 7 illustrates an N-type GTO including a buffer layer according to the second embodiment of the present disclosure.
Figure 7:
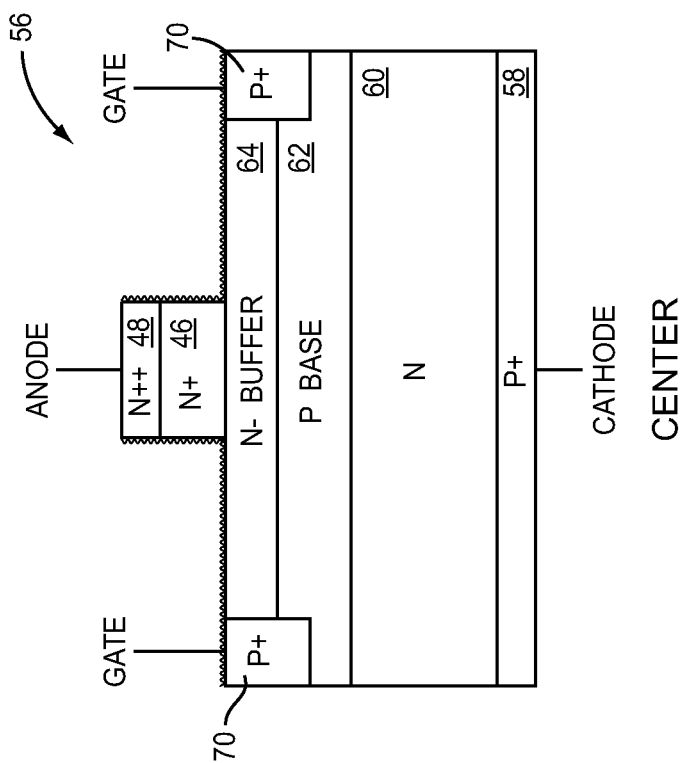

While the GTOs 34 and 34' of FIGS. 4A through 4C and FIG. 5 are P-type GTOs, the same concepts may be applied to N-type GTOs 56 and 56', as illustrated in FIGS. 6 and 7. As illustrated in FIG. 6, the GTOs 56 and 56' include a number of semiconductor layers 58 through 68 of a desired semiconductor material. The semiconductor layers 58 through 68 are preferably epitaxially grown layers of the desired semiconductor material. In the preferred embodiment, the semiconductor layers 58 through 68 are SiC. However, the present disclosure is not limited thereto. Other semiconductor materials may be used as will be appreciated by one of ordinary skill in the art upon reading this disclosure. The semiconductor layers 58 through 68 include a P-type semiconductor layer 58 that is highly doped, an N-type semiconductor layer 60 on the P-type semiconductor layer 58, a P-type base layer 62 epitaxially grown on the N-type semiconductor layer 60, an N-type buffer layer 64 epitaxially grown on the P-type base layer 62 and that is lightly doped, an N-type semiconductor layer 66 on the N-type buffer layer 64 and that is highly doped, and an N-type semiconductor layer 68 on the N-type semiconductor layer 66 and that is very highly doped. The N-type semiconductor layers 66 and 68 may also be referred to herein as contact layers. Note that, while not illustrated, one of ordinary skill in the art will readily appreciate that one or more of the semiconductor layers 58 through 68 may include sub-layers. For example, the N-type semiconductor layer 60 may include an N-type sub-layer (e.g., an isolation layer) on the P-type semiconductor layer 58 and a lightly doped N-type sub-layer (e.g., a drift layer) on the N-type sub-layer. As used herein, unless otherwise stated, a highly doped semiconductor layer has a doping level of greater than or equal to about $1 \times 10^{18}$ carriers (i.e., electrons or holes) per $cm^3$, a very highly doped semiconductor layer has a doping level in a range of about and including $5 \times 10^{18}$ to $2 \times 10^{20}$ carriers per $cm^3$, and a lightly doped semiconductor layer has a doping level of less than or equal to about $1 \times 10^{17}$ carriers per $cm^3$.

As illustrated, the N-type semiconductor layers 66 and 68 have been etched such that, after etching, the N-type semiconductor layers 66 and 68 form anodes of the GTOs 56 and 56'. Note that the P-type semiconductor layer 58 forms cathodes of the GTOs 56 and 56'. In one embodiment, the N-type semiconductor layers 66 and 68 are etched via RIE. For the GTO 56 fabricated near the center of the semiconductor wafer, the N-type semiconductor layers 66 and 68 are etched to a desired etching depth ($D_{ETCH}$). However, due to non-uniform etching across the semiconductor wafer, etching near the outer edge of the semiconductor wafer is faster than etching near the center of the semiconductor wafer. As a result, over-etching occurs for the GTO 56' fabricated near the outer edge of the semiconductor wafer. An amount of over-etch (OVER-ETCH) is a function of both the type of etching (e.g., RIE) and a position of the GTO 56' on the semiconductor wafer. For this discussion, the GTO 56' is fabricated at a position on the semiconductor wafer having a maximum amount of over-etch.

In this embodiment, a thickness of the N-type buffer layer 64 is equal to, or at least approximately equal to, the maximum amount of over-etch. As an example, if the maximum amount of over-etch is 20% of the desired etching depth ($D_{ETCH}$), then the thickness of the N-type buffer layer 64 may be $0.2 \times D_{ETCH}$. Thus, as a more specific example, if the desired etching depth ($D_{ETCH}$) is 1.5 microns, then the thickness of the N-type buffer layer 64 may be 0.3 microns or approximately 0.3 microns. It should be noted that while in this example the thickness of the N-type buffer layer 64 is equal to, or at least approximately equal to, the maximum amount of over-etch, the present disclosure is not limited thereto. More specifically, in another embodiment, the thickness of the N-type buffer layer 64 may be the maximum amount of over-etch minus a predetermined acceptable amount of over-etch into the P-type base layer 62. The acceptable amount of over-etch into the P-type base layer 62 is an amount of over-etch that can occur without the GTO 56' failing to operate as intended. In one embodiment, the doping level of the N-type buffer layer 64 is in a range of about and including $1 \times 10^{16}$ and $1 \times 10^{17}$ carriers per $cm^3$, and the thickness of the N-type buffer layer 64 is in a range of about and including 0.1 to 0.3 microns. In contrast, in one embodiment, a doping level of the P-type base layer 62 is in a range of about and including $1 \times 10^{17}$ and $1 \times 10^{18}$ carriers per $cm^3$, and a thickness of the P-type base layer 62 in a range of about and including 0.5 to 5 microns.

In addition to compensating for the non-uniform etching on the semiconductor wafer, the N-type buffer layer 64 also mitigates or eliminates surface recombination particularly for the GTO 56 fabricated near the center of the semiconductor wafer. More specifically, as a result of the etching process, there is substantial damage to the crystalline structure both at sidewall surfaces of the N-type semiconductor layers 66 and 68 forming the anode of the GTO 56 and a surface of the N-type buffer layer 64. Likewise, there is substantial damage to the crystalline structure both at: (1) sidewall surfaces of the N-type semiconductor layers 66 and 68 forming the anode of the GTO 56' and the N-type buffer layer 64 due to over-etching and (2) the surface of the P-type base layer 62. The damage to the crystalline structure at the surfaces of the GTOs 56 and 56' results in interface charge, or surface traps, at those surfaces. For the GTO 56 fabricated near the center of the semiconductor wafer, the N-type buffer layer 64 moves the interface charge away from the P-type base layer 62 (i.e., the interface charge is at the surface of the N-type buffer layer 64 rather than the surface of the P-type base layer 62). As a result, surface recombination is reduced (i.e., the number of electrons injected into the P-type base layer 62 that are trapped by the interface charge is reduced as compared to that of the traditional GTO 10 (FIGS. 1A through 1C) where the interface charge is directly on the surface of the N-type base layer 18). The reduction in surface recombination increases the gain ($\beta$) of the top transistor of the GTO 56 as compared to that of the traditional GTO 10, which in turn decreases the turn-on current ($I_{G,TURN-ON}$) of the GTO 56 as compared to that of the traditional GTO 10.

Lastly, P+ wells 70 and 70' are formed in the P-type base layer 62 of the GTOs 56 and 56', respectively, via ion implantation, where the P+ wells 70 and 70' form gates of the GTOs 56 and 56'. The P+ wells 70 of the GTO 56 extend through the N-type buffer layer 64 into the P-type base layer 62. Because the N-type buffer layer 64 is lightly doped, the N-type buffer layer 64 has a high resistivity such that the anode and gates of the GTO 56 are not shorted. Note that while the GTOs 56 and 56' of this embodiment each include two P+ wells 70 and 70', respectively, and thus two gates, the GTOs 56 and 56' may alternatively include only one P+ well 70 and 70' and thus one gate each. It should also be noted that the anode, cathode, and gate(s) of the GTOs 56 and 56' may more generally be referred to herein as contact regions. While not shown, a passivation layer may optionally be formed over the surfaces of the GTOs 56 and 56'. The passivation layer may be $SiO_2$, SiN, or other suitable material.

FIG. 7 illustrates the GTOs 56 and 56' of FIG. 6 according to another embodiment of the present disclosure. In this embodiment, the thickness of the N-type buffer layer 64 is greater than the maximum amount of over-etch. As a result, a portion of the N-type buffer layer 64 remains on the surface of the P-type base layer 62 even for the GTO 56' that experiences the maximum amount of over-etch. By doing so, the interface charge resulting from the damage to the crystalline structure during etching of the N-type semiconductor layers 66 and 68 to form the anode of the GTO 56' is at the surface of the remaining portion of the N-type buffer layer 64 and therefore is moved away from the P-type base layer 62. Thus, in this embodiment, the N-type buffer layer 64 reduces surface recombination for both the GTO 56 fabricated near the center of the semiconductor wafer and the GTO 56' fabricated near the outer edge of the semiconductor wafer.

FIGS. 8A through 8D illustrate GTOs 72 and 72' fabricated near a center of a semiconductor wafer and near an outer edge of the semiconductor wafer, respectively, according to another embodiment of the present disclosure. In general, the GTOs 72 and 72' are similar to the GTOs 34 and 34' of FIGS. 4A through 4C. However, in this embodiment, the buffer layer is of the same doping type as the base layer and the GTOs 72 and 72' further include a ledge layer, as described below. As illustrated, fabrication of both the GTO 72 fabricated near the center of the semiconductor wafer and the GTO 72' fabricated near the outer edge of the semiconductor wafer begins with a structure 74 including a number of semiconductor layers 76 through 86 of a desired semiconductor material. The semiconductor layers 76 through 86 are preferably epitaxially grown layers of the desired semiconductor material. In the preferred embodiment, the semiconductor layers 76 through 86 are SiC. However, the present disclosure is not limited thereto. Other semiconductor materials may be used as will be appreciated by one of ordinary skill in the art upon reading this disclosure.

The structure 74 includes an N-type semiconductor layer 76 that is highly doped, a P-type semiconductor layer 78 on the N-type semiconductor layer 76, an N-type base layer 80 epitaxially grown on the P-type semiconductor layer 78, an N-type buffer layer 82 epitaxially grown on the N-type base layer 80 and that is lightly doped, a P-type semiconductor layer 84 on the N-type buffer layer 82 and that is highly doped, and a P-type semiconductor layer 86 on the P-type semiconductor layer 84 and that is very highly doped. The P-type semiconductor layers 84 and 86 may also be referred to herein as contact layers. Note that, while not illustrated, one of ordinary skill in the art will readily appreciate that one or more of the semiconductor layers 76 through 86 may include sub-layers. For example, the P-type semiconductor layer 78 may include a P-type sub-layer (e.g., an isolation layer) on the N-type semiconductor layer 76 and a lightly doped P-type sub-layer (e.g., a drift layer) on the P-type sub-layer. As used herein, unless otherwise stated, a highly doped semiconductor layer has a doping level of greater than or equal to about $1 \times 10^{18}$ carriers (i.e., electrons or holes) per $cm^3$, a very highly doped semiconductor layer has a doping level in a range of about and including $5 \times 10^{18}$ to $2 \times 10^{20}$ carriers per $cm^3$, and a lightly doped semiconductor layer has a doping level of less than or equal to about $1 \times 10^{17}$ carriers per $cm^3$.

Figure 8A:
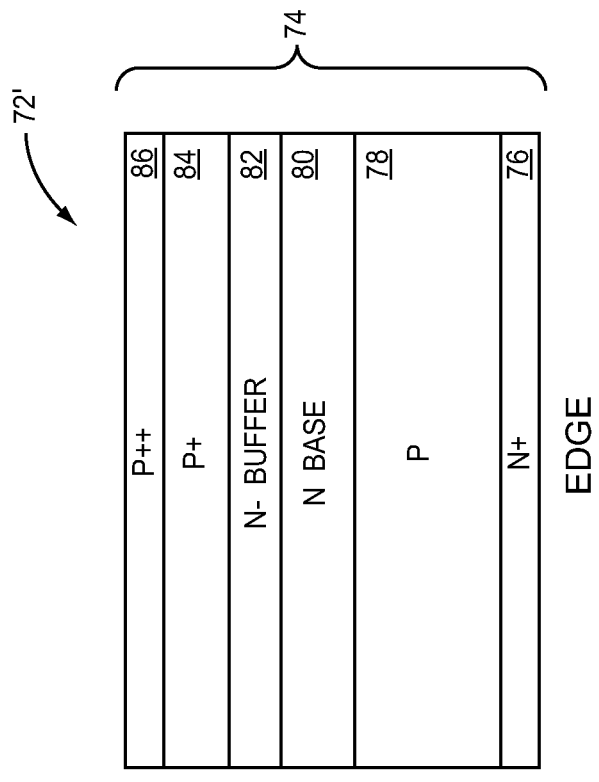
FIGS. 8A through 8D illustrate a P-type GTO including a buffer layer and a ledge layer and a method of fabrication thereof according to a third embodiment of the present disclosure.
Figure 8A:
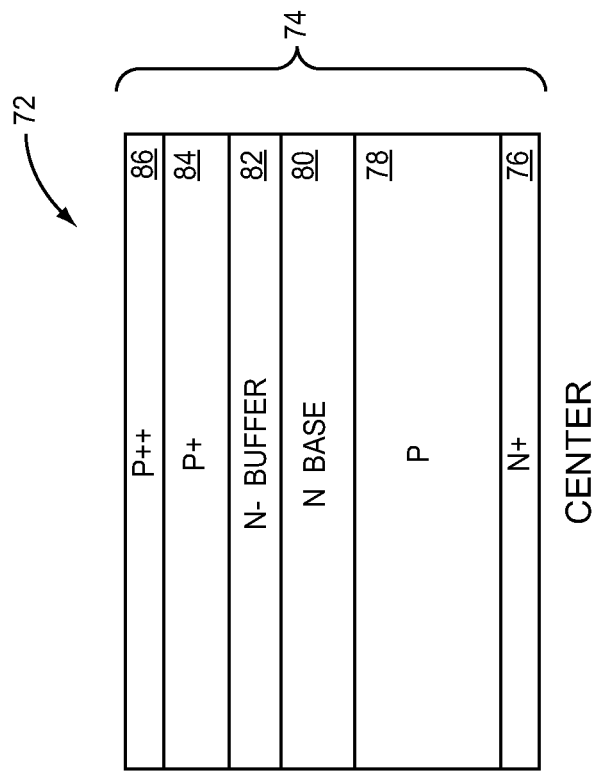
Figure 8B:
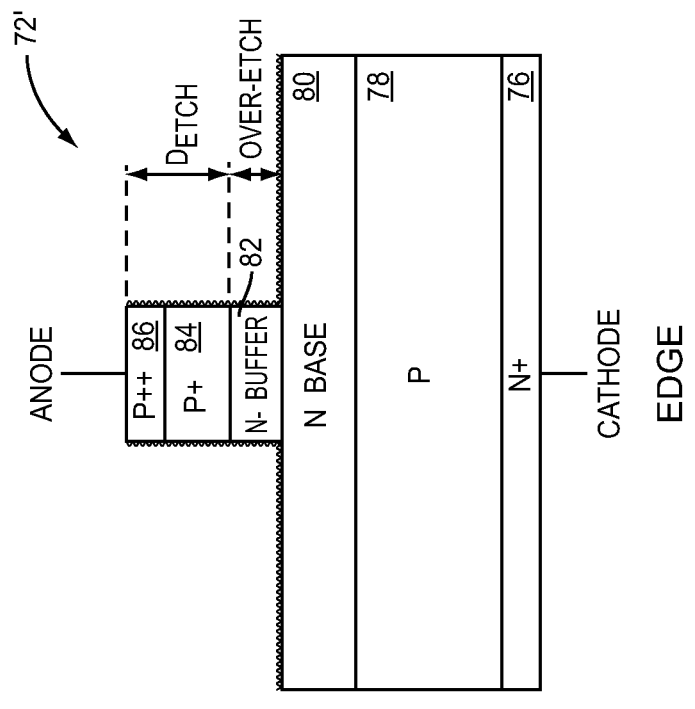
Figure 8B:
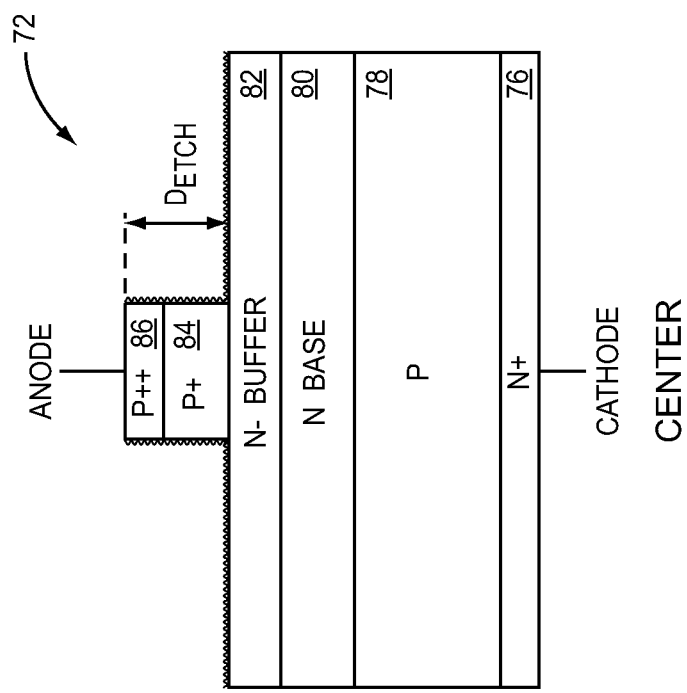

As illustrated in FIG. 8B, the P-type semiconductor layers 84 and 86 are etched such that, after etching, the P-type semiconductor layers 84 and 86 form anodes of the GTOs 72 and 72'. Note that the N-type semiconductor layer 76 forms cathodes of the GTOs 72 and 72'. In one embodiment, the P-type semiconductor layers 84 and 86 are etched via RIE. For the GTO 72 fabricated near the center of the semiconductor wafer, the P-type semiconductor layers 84 and 86 are etched to a desired etching depth ($D_{ETCH}$). However, due to non-uniform etching across the semiconductor wafer, etching near the outer edge of the semiconductor wafer is faster than etching near the center of the semiconductor wafer. As a result, over-etching occurs for the GTO 72' fabricated near the outer edge of the semiconductor wafer. An amount of over-etch (OVER-ETCH) is a function of both the type of etching (e.g., RIE) and a position of the GTO 72' on the semiconductor wafer. For this discussion, the GTO 72' is fabricated at a position on the semiconductor wafer having a maximum amount of over-etch.

In this embodiment, a thickness of the N-type buffer layer 82 is equal to, or at least approximately equal to, the maximum amount of over-etch. As an example, if the maximum amount of over-etch is 20% of the desired etching depth ($D_{ETCH}$), then the thickness of the N-type buffer layer 82 may be $0.2 \times D_{ETCH}$. Thus, as a more specific example, if the desired etching depth ($D_{ETCH}$) is 1.5 microns, then the thickness of the N-type buffer layer 82 may be 0.3 microns or approximately 0.3 microns. It should be noted that while in this example the thickness of the N-type buffer layer 82 is equal to, or at least approximately equal to, the maximum amount of over-etch, the present disclosure is not limited thereto. More specifically, in another embodiment, the thickness of the N-type buffer layer 82 may be the maximum amount of over-etch minus a predetermined acceptable amount of over-etch into the N-type base layer 80. The acceptable amount of over-etch into the N-type base layer 80 is an amount of over-etch that can occur without the GTO 72' failing to operate as intended. In one embodiment, the doping level of the N-type buffer layer 82 is in a range of about and including $1 \times 10^{16}$ and $1 \times 10^{17}$ carriers per $cm^3$, and the thickness of the N-type buffer layer 82 is in a range of about and including 0.1 to 0.3 microns. In contrast, in one embodiment, a doping level of the N-type base layer 80 is in a range of about and including $1 \times 10^{17}$ and $1 \times 10^{18}$ carriers per $cm^3$, and a thickness of the N-type base layer 80 in a range of about and including 0.5 to 5 microns.

Figure 8C:
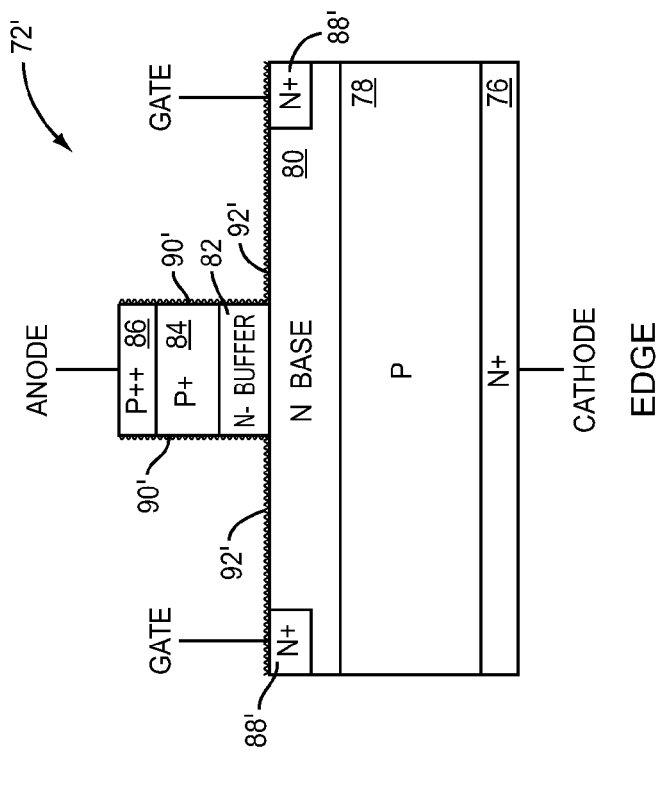
Figure 8C:
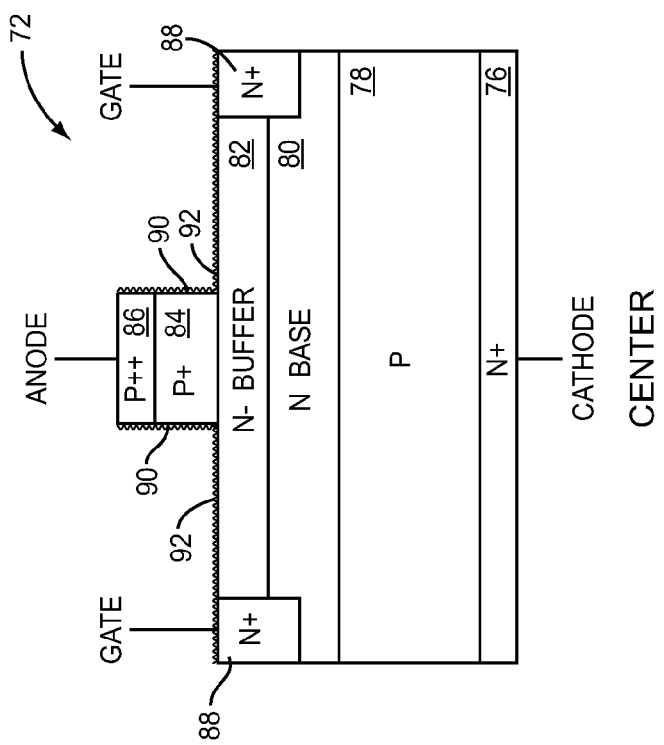

Next, as illustrated in FIG. 8C, N+ wells 88 and 88' are formed in the N-type base layer 80 of the GTOs 72 and 72', respectively, via ion implantation, where the N+ wells 88 and 88' form gates of the GTOs 72 and 72'. The N+ wells 88 of the GTO 72 extend through the N-type buffer layer 82 into the N-type base layer 80. Note that while the GTOs 72 and 72' of this embodiment include two N+ wells 88 and 88' and thus two gates, the GTOs 72 and 72' may alternatively include only one N+ well 88 and 88' and one gate. It should also be noted that the anode, cathode, and gate(s) of the GTOs 72 and 72' may more generally be referred to herein as contact regions.

As illustrated in FIG. 8C, as a result of the etching process used to etch the P-type semiconductor layers 84 and 86 to form the anode of the GTO 72, there is substantial damage to the crystalline structure both at sidewall surfaces 90 of the P-type semiconductor layers 84 and 86 forming the anode of the GTO 72 and a surface 92 of the N-type buffer layer 82. Likewise, for the GTO 72', there is substantial damage to the crystalline structure both at: (1) sidewall surfaces 90' of the P-type semiconductor layers 84 and 86 forming the anode of the GTO 72' and the N-type buffer layer 82 due to over-etching and (2) a surface 92' of the N-type base layer 80. The damage to the crystalline structure at the sidewall surfaces 90 and 90' and the surfaces 92 and 92' of the GTOs 72 and 72' results in interface charge, or surface traps, at those surfaces 90, 90', 92, and 92'.

Figure 8D:
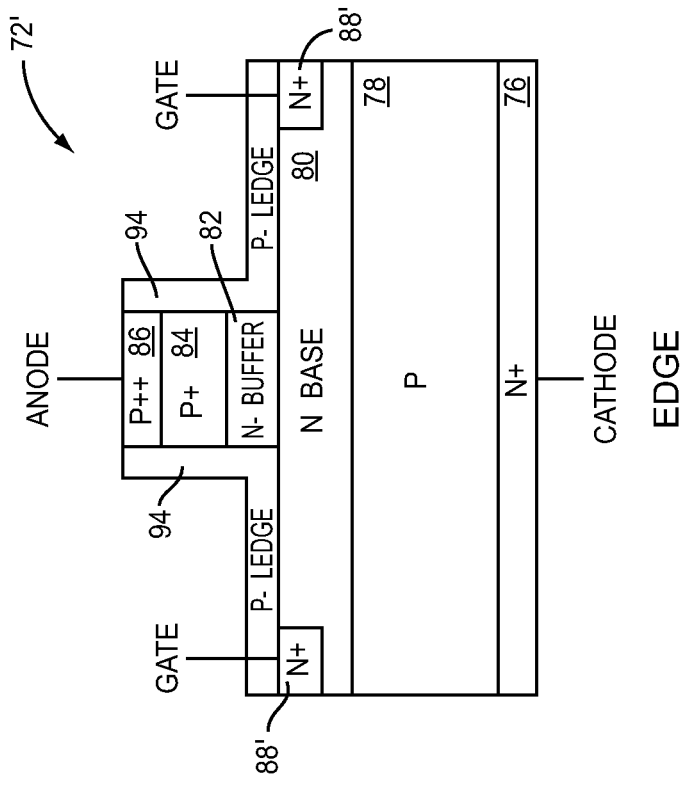
Figure 8D:
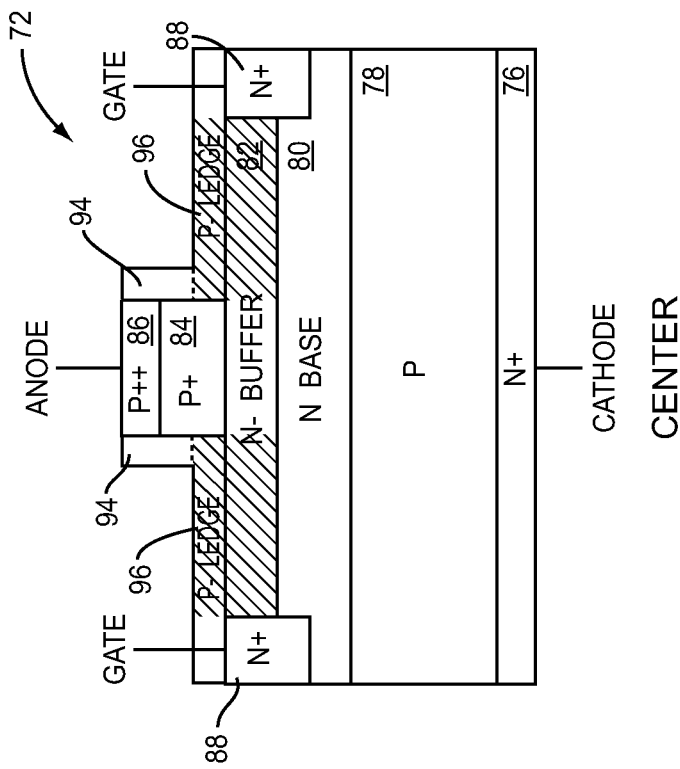

In order to mitigate or eliminate the interface charge at the surfaces 90, 90', 92, and 92' of the GTOs 72 and 72', a P-type ledge layer 94 of the same semiconductor material as the semiconductor layers 76 through 86 is epitaxially grown on the surfaces 90, 90', 92, and 92' of the GTOs 72 and 72', as illustrated in FIG. 8D. The P-type ledge layer 94 is lightly doped. In one embodiment, the P-type ledge layer 94 has a doping level in a range of about and including $5 \times 10^{15}$ to $1 \times 10^{17}$ carriers per $cm^3$ and a thickness in a range of about and including 1000 to 3000 Angstroms. In one particular embodiment, the P-type ledge layer 94 has the same, or at least approximately the same, doping level and thickness as the N-type buffer layer 82. In one embodiment, both the semiconductor layers 76 through 86 and the P-type ledge layer 94 are formed of SiC. Further, because the P-type ledge layer 94 is epitaxially grown, the P-type ledge layer 94 is a high quality material layer that provides improved passivation of the surfaces 90, 90', 92, and 92' as compared to traditional passivation layers such as layers of $SiO_2$ and SiN. In addition, during epitaxial growth of the P-type ledge layer 94, which may also be referred to herein as a regrowth process, the GTOs 72 and 72' may be heated as part of the regrowth process such that some of the damaged material on the surfaces 90, 90', 92, and 92' is removed via evaporation, thereby improving the quality of the surfaces 90, 90', 92, and 92' and reducing the interface charge at the surfaces 90, 90', 92, and 92'. As a result of the passivation provided by the P-type ledge layer 94, interface charge at the surfaces 90, 90', 92, and 92' is reduced, thereby increasing the gain ($\beta$) of the top transistor of the GTOs 72 and 72', which in turn decreases the turn-on current ($I_{G,TURN-ON}$) of the GTOs 72 and 72'.

In addition, for the GTO 72 formed near the center of the semiconductor wafer, the P-type ledge layer 94 and the N-type buffer layer 82 create fully depleted regions 96. The fully depleted regions 96 have high resistivity. The high resistivity of the fully depleted regions 96 further reduces surface recombination for the GTO 72 by preventing, or at least mitigating, the flow of electrons injected into the N-type base layer 80 of the GTO 72 from the N-type base layer 80 to the interface charge, or surface traps, at the surface 92 of the N-type buffer layer 82. While not shown, a passivation layer may optionally be formed over the P-type ledge layer 94 of the GTOs 72 and 72'. The passivation layer may be $SiO_2$, SiN, or other suitable material.

Figure 9:
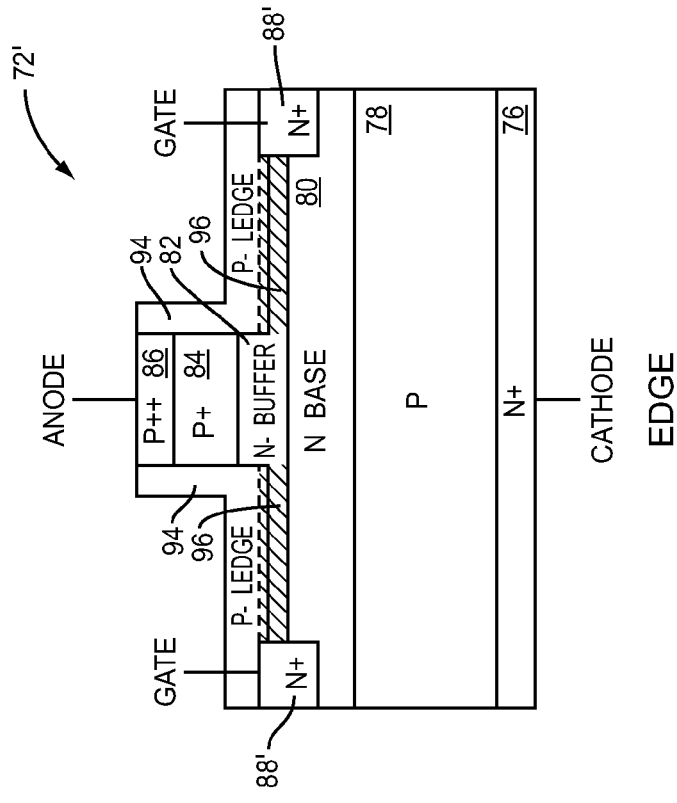
FIG. 9 illustrates a P-type GTO including a buffer layer and a ledge layer according to a fourth embodiment of the present disclosure.
Figure 9:
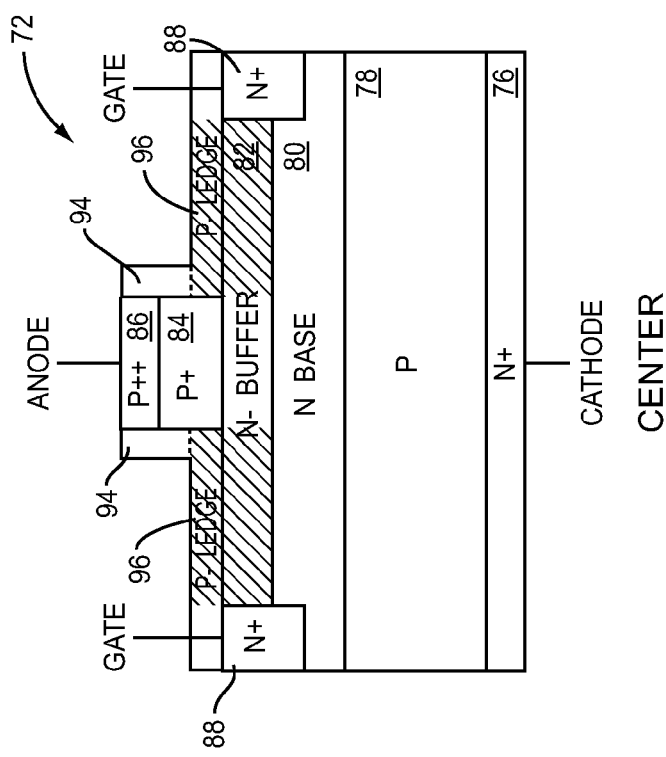

FIG. 9 illustrates the GTOs 72 and 72' of FIGS. 8A through 8C according to another embodiment of the present disclosure. In this embodiment, the thickness of the N-type buffer layer 82 is greater than the maximum amount of over-etch. As a result, a portion of the N-type buffer layer 82 remains on the surface of the N-type base layer 80 even for the GTO 72' that experiences the maximum amount of over-etch. By doing so, the P-type ledge layer 94 and the N-type buffer layer 82 form the fully depleted regions 96 that further mitigate or eliminate surface recombination for both the GTO 72 fabricated near the center of the semiconductor wafer and the GTO 72' fabricated near the outer edge of the semiconductor wafer.

Figure 10:
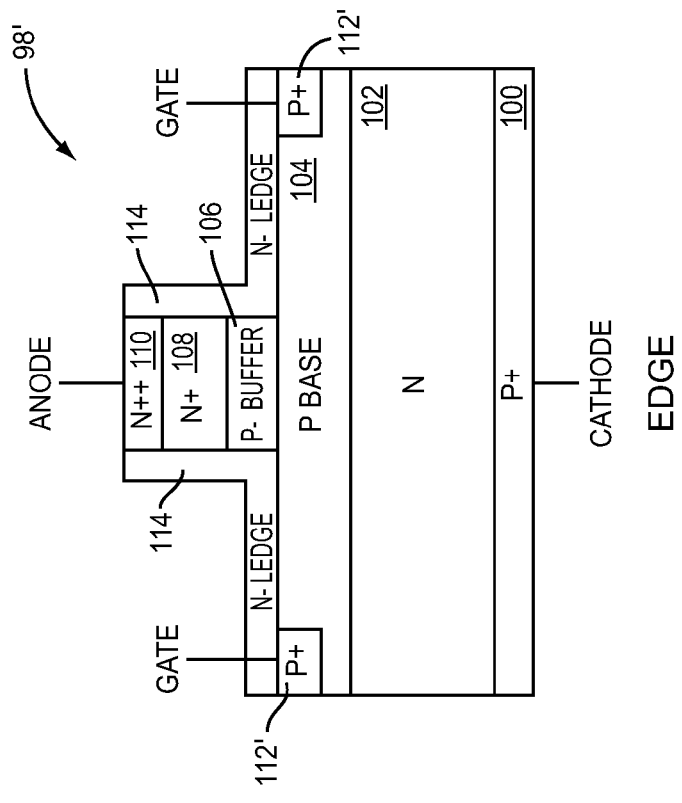
FIG. 10 illustrates an N-type GTO including a buffer layer and a ledge layer according to the third embodiment of the present disclosure.
Figure 10:
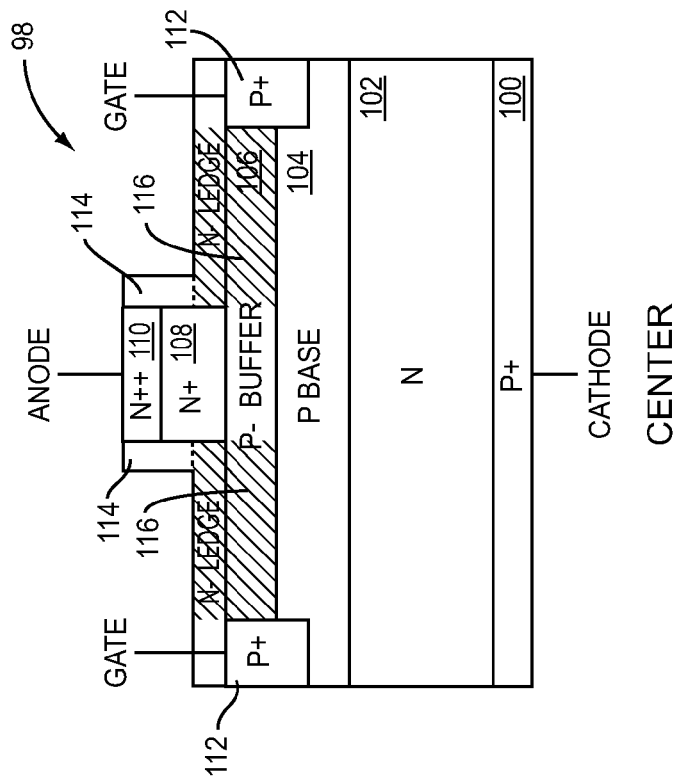
Figure 11:
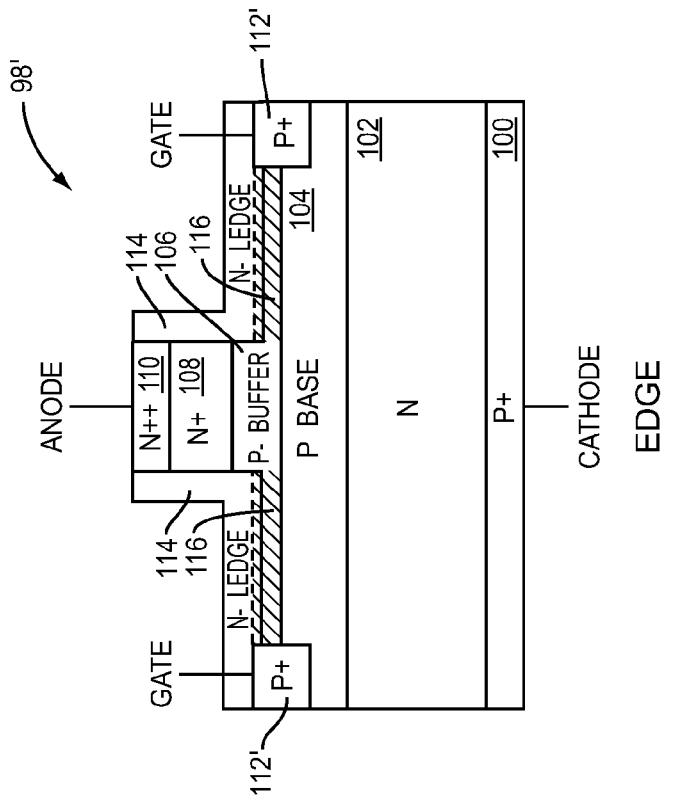
FIG. 11 illustrates an N-type GTO including a buffer layer and a ledge layer according to the fourth embodiment of the present disclosure.
Figure 11:
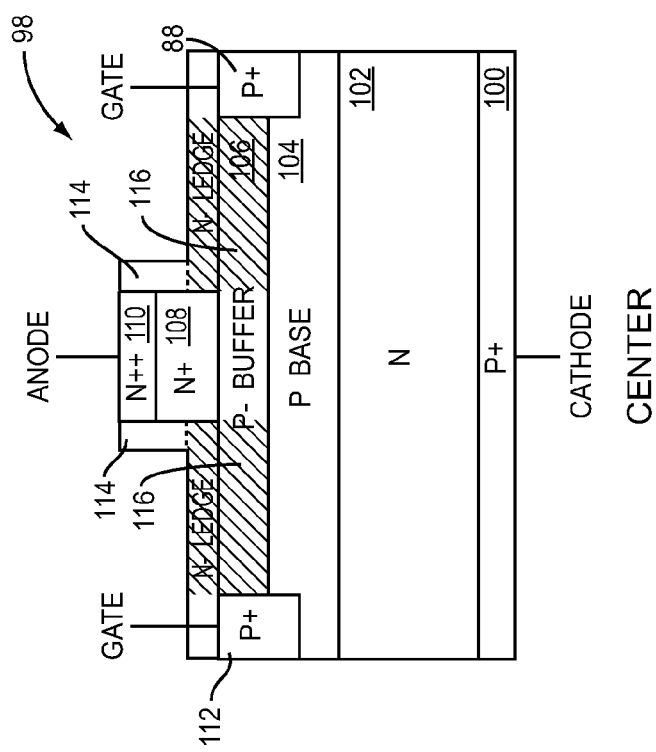

While the GTOs 72 and 72' of FIGS. 8A through 8D and FIG. 9 are P-type GTOs, the same concepts may be applied to N-type GTOs 98 and 98', as illustrated in FIGS. 10 and 11. As illustrated in FIG. 10, both the GTO 98 fabricated near the center of the semiconductor wafer and the GTO 98' fabricated near the outer edge of the semiconductor wafer include a number of semiconductor layers 100 through 110 of a desired semiconductor material. The semiconductor layers 100 through 110 are preferably epitaxially grown layers of the desired semiconductor material. In the preferred embodiment, the semiconductor layers 100 through 110 are SiC. However, the present disclosure is not limited thereto. Other semiconductor materials may be used as will be appreciated by one of ordinary skill in the art upon reading this disclosure.

The semiconductor layers 100 through 110 include a P-type semiconductor layer 100 that is highly doped, an N-type semiconductor layer 102 on the P-type semiconductor layer 100, a P-type base layer 104 epitaxially grown on the N-type semiconductor layer 102, a P-type buffer layer 106 epitaxially grown on the P-type base layer 104 and that is lightly doped, an N-type semiconductor layer 108 on the P-type buffer layer 106 and that is highly doped, and an N-type semiconductor layer 110 on the N-type semiconductor layer 108 and that is very highly doped. The N-type semiconductor layers 108 and 110 may also be referred to herein as contact layers. Note that, while not illustrated, one of ordinary skill in the art will readily appreciate that one or more of the semiconductor layers 100 through 110 may include sub-layers. For example, the N-type semiconductor layer 102 may include an N-type sub-layer (e.g., an isolation layer) on the P-type semiconductor layer 100 and a lightly doped N-type sub-layer (e.g., a drift layer) on the N-type sub-layer. As used herein, unless otherwise stated, a highly doped semiconductor layer has a doping level of greater than or equal to about $1\times10^{18}$ carriers (i.e., electrons or holes) per $cm^3$, a very highly doped semiconductor layer has a doping level in a range of about and including $5\times10^{18}$ to $2\times10^{20}$ carriers per $cm^3$, and a lightly doped semiconductor layer has a doping level of less than or equal to about $1\times10^{17}$ carriers per $cm^3$.

The N-type semiconductor layers 108 and 110 have been etched such that, after etching, the N-type semiconductor layers 108 and 110 form anodes of the GTOs 98 and 98'. Note that the P-type semiconductor layer 100 forms cathodes of the GTOs 98 and 98'. In one embodiment, the N-type semiconductor layers 108 and 110 are etched via RIE. For the GTO 98 fabricated near the center of the semiconductor wafer, the N-type semiconductor layers 108 and 110 are etched to a desired etching depth ($D_{ETCH}$). However, due to non-uniform etching across the semiconductor wafer, etching near the outer edge of the semiconductor wafer is faster than etching near the center of the semiconductor wafer. As a result, over-etching occurs for the GTO 98' fabricated near the outer edge of the semiconductor wafer. An amount of over-etch (OVER-ETCH) is a function of both the type of etching (e.g., RIE) and a position of the GTO 98' on the semiconductor wafer. For this discussion, the GTO 98' is fabricated at a position on the semiconductor wafer having a maximum amount of over-etch.

In this embodiment, a thickness of the P-type buffer layer 106 is equal to, or at least approximately equal to, the maximum amount of over-etch. As an example, if the maximum amount of over-etch is 20% of the desired etching depth ($D_{ETCH}$), then the thickness of the P-type buffer layer 106 may be $0.2\times D_{ETCH}$. Thus, as a more specific example, if the desired etching depth ($D_{ETCH}$) is 1.5 microns, then the thickness of the P-type buffer layer 106 may be 0.3 microns or approximately 0.3 microns. It should be noted that while in this example the thickness of the P-type buffer layer 106 is equal to, or at least approximately equal to, the maximum amount of over-etch, the present disclosure is not limited thereto. More specifically, in another embodiment, the thickness of the P-type buffer layer 106 may be the maximum amount of over-etch minus a predetermined acceptable amount of over-etch into the P-type base layer 104. The acceptable amount of over-etch into the P-type base layer 104 is an amount of over-etch that can occur without the GTO 98' failing to operate as intended. In one embodiment, the doping level of the P-type buffer layer 106 is in a range of about and including $1\times10^{16}$ and $1\times10^{17}$ carriers per $cm^3$, and the thickness of the P-type buffer layer 106 is in a range of about and including 0.1 to 0.3 microns. In contrast, in one embodiment, a doping level of the P-type base layer 104 is in a range of about and including $1\times10^{17}$ and $1\times10^{18}$ carriers per $cm^3$, and a thickness of the P-type base layer 104 is in a range of about and including 0.5 to 5 microns.

P+ wells 112 and 112' are formed in the P-type base layer 104 of the GTOs 98 and 98', respectively, via ion implantation, where the P+ wells 112 and 112' form gates of the GTOs 98 and 98'. The P+ wells 112 of the GTO 98 extend through the P-type buffer layer 106 into the P-type base layer 104. Note that while the GTOs 98 and 98' of this embodiment include two P+ wells 112 and 112' and thus two gates, the GTOs 98 and 98' may alternatively include only one P+ well 112 and 112' and one gate. It should also be noted that the anode, cathode, and gate(s) of the GTOs 98 and 98' may more generally be referred to herein as contact regions.

As a result of the etching process used to etch the N-type semiconductor layers 108 and 110 to form the anode of the GTO 98, there is substantial damage to the crystalline structure both at sidewall surfaces of the N-type semiconductor layers 108 and 110 forming the anode of the GTO 98 and a surface of the P-type buffer layer 106. Likewise, for the GTO 98', there is substantial damage to the crystalline structure both at: (1) sidewall surfaces of the N-type semiconductor layers 108 and 110 forming the anode of the GTO 98' and the P-type buffer layer 106 due to over-etching and (2) a surface of the P-type base layer 104. The damage to the crystalline structure at the surfaces of the GTOs 98 and 98' results in interface charge, or surface traps, at those surfaces.

In order to mitigate or eliminate the interface charge at the surfaces of the GTOs 98 and 98', an N-type ledge layer 114 of the same semiconductor material as the semiconductor layers 100 through 110 is epitaxially grown on the surfaces of the GTOs 98 and 98'. The N-type ledge layer 114 is lightly doped. In one embodiment, the N-type ledge layer 114 has a doping level in a range of about and including $5\times10^{15}$ and $1\times10^{17}$ carriers per $cm^3$ and a thickness in a range of about and including 1000 to 3000 Angstroms. In one particular embodiment, the N-type ledge layer 114 has the same, or at least approximately the same, doping level and thickness as the P-type buffer layer 106. In one embodiment, both the semiconductor layers 100 through 110 and the N-type ledge layer 114 are formed of SiC. Further, because the N-type ledge layer 114 is epitaxially grown, the N-type ledge layer 114 is a high quality material layer that provides improved passivation of the surfaces as compared to traditional passivation layers such as layers of $SiO_2$ and Silicon Nitride SiN. In addition, during epitaxial growth of the N-type ledge layer 114, which may also be referred to herein as a regrowth process, the GTOs 98 and 98' may be heated as part of the regrowth process such that some of the damaged material on the surfaces is removed via evaporation, thereby improving the quality of the surfaces and reducing the interface charge at the surfaces. As a result of the passivation provided by the N-type ledge layer 114, interface charge at the surfaces is reduced, thereby increasing the gain ($\beta$) of the top transistor of the GTOs 98 and 98', which in turn decreases the turn-on current ($I_{G,TURN-ON}$) of the GTOs 98 and 98'.

In addition, for the GTO 98 formed near the center of the semiconductor wafer, the N-type ledge layer 114 and the P-type buffer layer 106 create fully depleted regions 116. The fully depleted regions 116 have high resistivity. The high resistivity of the fully depleted regions 116 further reduces surface recombination for the GTO 98 by preventing, or at least mitigating, the flow of electrons injected into the P-type base layer 104 of the GTO 98 from the P-type base layer 104 to the interface charge, or surface traps, at the surface of the P-type buffer layer 106. While not shown, a passivation layer may optionally be formed over the N-type ledge layer 114 of the GTOs 98 and 98'. The passivation layer may be $SiO_2$, SiN, or other suitable material.

FIG. 11 illustrates the GTOs 98 and 98' of FIG. 10 according to another embodiment of the present disclosure. In this embodiment, the thickness of the P-type buffer layer 106 is greater than the maximum amount of over-etch. As a result, a portion of the P-type buffer layer 106 remains on the surface of the P-type base layer 104 even for the GTO 98' that experiences the maximum amount of over-etch. By doing so, the N-type ledge layer 114 and the P-type buffer layer 106 form the fully depleted regions 116 that further mitigate or eliminate surface recombination for both the GTO 98 fabricated near the center of the semiconductor wafer and the GTO 98' fabricated near the outer edge of the semiconductor wafer.

Again, it should be noted that while the discussion herein focuses on the GTOs 34, 34', 56, 56', 72, 72', 98, and 98', the concepts disclosed herein are equally applicable to other types of PN junction based devices such as, for example, BJTs, MCTs, or the like. For example, the structures of FIGS. 4A through 4C, FIGS. 5 through 7, FIGS. 8A through 8D, and FIGS. 9 through 11 may easily be altered to form corresponding BJTs by omitting the bottom semiconductor layers 38, 58, 76, and 100, respectively. Then, using the structure of FIG. 4C as an example, the P-type semiconductor layers 46 and 48 may form an emitter of a corresponding PNP BJT, the N+ wells 54 may form a base of the corresponding PNP BJT, and the P-type semiconductor layer 40 may form a collector of the corresponding PNP BJT. In a similar manner, the concepts disclosed herein are also applicable to MCTs.

Those skilled in the art will recognize improvements and modifications to the preferred embodiments of the present disclosure. All such improvements and modifications are considered within the scope of the concepts disclosed herein and the claims that follow.

What is claimed is:

1. An electronic device including a plurality of layers comprising:
   a semiconductor base layer of a first doping type;
   a semiconductor buffer layer on the semiconductor base layer; and
   one or more contact layers on the semiconductor buffer layer that form a first contact region of the electronic device and that are of a second doping type that is opposite the first doping type;
   wherein a thickness of the semiconductor buffer layer compensates for over etch when etching the one or more contact layers to form the first contact region due to non-uniformity of etching on a semiconductor wafer on which the electronic device is fabricated.

2. The electronic device of claim 1 wherein the thickness of the semiconductor buffer layer is at least approximately equal to a maximum amount of over-etch on the semiconductor wafer when etching the one or more contact layers to form the first contact region due to non-uniformity of etching on the semiconductor wafer.

3. The electronic device of claim 1 wherein the thickness of the semiconductor buffer layer is greater than or equal to a maximum amount of over-etch on the semiconductor wafer when etching the one or more contact layers to form the first contact region due to non-uniformity of etching on the semiconductor wafer.

4. The electronic device of claim 1 wherein the thickness of the semiconductor buffer layer is greater than or equal to a maximum amount of over-etch on the semiconductor wafer when etching the one or more contact layers to form the first contact region due to non-uniformity of etching on the semiconductor wafer minus a predetermined acceptable amount of over-etch into the semiconductor base layer.

5. The electronic device of claim 1 wherein the thickness of the semiconductor buffer layer is in a range of about and including 0.1 to 0.3 micrometers.

6. The electronic device of claim 1 wherein the semiconductor buffer layer is a lightly doped semiconductor buffer layer of the first doping type.

7. The electronic device of claim 6 further comprising a semiconductor ledge layer on a sidewall of the one or more contact layers etched to form the first contact region and a surface of one of a group consisting of:
   the semiconductor buffer layer if an amount of over-etch when etching the one or more contact layers to form the first contact region is less than the thickness of the semiconductor buffer layer; and
   the semiconductor base layer if the amount of over-etch when etching the one or more contact layers to form the first contact region is greater than or equal to the thickness of the semiconductor buffer layer;
   wherein the semiconductor ledge layer is of the second doping type.

8. The electronic device of claim 7 wherein the semiconductor ledge layer is a lightly doped semiconductor ledge layer.

9. The electronic device of claim 8 wherein a doping level of the lightly doped semiconductor ledge layer is in a range of about and including $5 \times 10^{15}$ to $1 \times 10^{17}$ carriers per centimeter cubed ($cm^3$).

10. The electronic device of claim 8 wherein a thickness of the lightly doped semiconductor ledge layer is in a range of about and including 1000 to 3000 Angstroms.

11. The electronic device of claim 7 wherein the semiconductor material is Silicon Carbide.

12. The electronic device of claim 1 wherein the semiconductor buffer layer is a lightly doped semiconductor buffer layer.

13. The electronic device of claim 12 wherein a doping level of the lightly doped semiconductor buffer layer is in a range of about and including $1 \times 10^{17}$ to $1 \times 10^{18}$ carriers per centimeter cubed (cm$^3$).

14. The electronic device of claim 1 wherein the semiconductor buffer layer is a lightly doped semiconductor buffer layer of the second doping type that is opposite the first doping type.

15. The electronic device of claim 1 wherein the semiconductor base layer, the semiconductor buffer layer, and the one or more contact layers are formed of Silicon Carbide.

16. The electronic device of claim 1 wherein a highly doped well is formed in the semiconductor base layer and is a second contact region of the electronic device.

17. The electronic device of claim 16 further comprising one or more semiconductor layers on which the semiconductor base layer is formed, and a bottom surface of the one or more semiconductor layers forms a third contact region of the electronic device.

18. The electronic device of claim 17 wherein the electronic device is a Gate Turn-Off Thyristor (GTO), and the first contact region is an anode of the GTO, the second contact region is a gate of the GTO, and the third contact region is a cathode of the GTO.

19. The electronic device of claim 17 wherein the electronic device is a Bipolar Junction Transistor (BJT), and the first contact region is an emitter of the BJT, the second contact region is a base of the BJT, and the third contact region is a collector of the BJT.

20. The electronic device of claim 1 wherein the electronic device is a MOS-Controlled Thyristor (MCT).

21. A method of fabricating an electronic device including a plurality of layers comprising:
   providing a semiconductor buffer layer on a semiconductor base layer, the semiconductor base layer having a first doping type;
   providing one or more contact layers on the semiconductor buffer layer, the one or more contact layers being of a second doping type that is opposite the first doping type; and
   etching the one or more contact layers to form a first contact region of the electronic device; and
   wherein a thickness of the semiconductor buffer layer compensates for over etch when etching the one or more contact layers to form the first contact region due to non-uniformity of etching on a semiconductor wafer on which the electronic device is fabricated.

22. The method of claim 21 wherein the thickness of the semiconductor buffer layer is at least approximately equal to a maximum amount of over-etch on the semiconductor wafer when etching the one or more contact layers to form the first contact region due to non-uniformity of etching on the semiconductor wafer.

23. The method of claim 21 wherein the thickness of the semiconductor buffer layer is greater than or equal to a maximum amount of over-etch on the semiconductor wafer when etching the one or more contact layers to form the first contact region due to non-uniformity of etching on the semiconductor wafer.

24. The method of claim 21 wherein the thickness of the semiconductor buffer layer is greater than or equal to a maximum amount of over-etch on the semiconductor wafer when etching the one or more contact layers to form the first contact region due to non-uniformity of etching on the semiconductor wafer minus a predetermined acceptable amount of over-etch into the semiconductor base layer.

25. The method of claim 21 wherein the thickness of the semiconductor buffer layer is in a range of about and including 0.1 to 0.3 micrometers.

26. The method of claim 21 wherein the semiconductor buffer layer is a lightly doped semiconductor buffer layer of the first doping type.

27. The method of claim 26 further comprising forming a semiconductor ledge layer on a sidewall of the one or more contact layers etched to form the first contact region and a surface of one of a group consisting of:
   the semiconductor buffer layer if an amount of over-etch when etching the one or more contact layers to form the first contact region is less than the thickness of the semiconductor buffer layer; and
   the semiconductor base layer if the amount of over-etch when etching the one or more contact layers to form the first contact region is greater than or equal to the thickness of the semiconductor buffer layer;
   wherein the semiconductor ledge layer is of the second doping type.

28. The method of claim 27 wherein the semiconductor ledge layer is a lightly doped semiconductor ledge layer.

29. The method of claim 28 wherein a doping level of the lightly doped semiconductor ledge layer is in a range of about and including $5 \times 10^{15}$ to $1 \times 10^{17}$ carriers per centimeter cubed (cm$^3$).

30. The method of claim 28 wherein a thickness of the lightly doped semiconductor ledge layer is in a range of about and including 1000 to 3000 Angstroms.

31. The method of claim 27 wherein the semiconductor material is Silicon Carbide.

32. The method of claim 21 wherein the semiconductor buffer layer is a lightly doped semiconductor buffer layer.

33. The method of claim 32 wherein a doping level of the lightly doped semiconductor buffer layer is in a range of about and including $1 \times 10^{17}$ to $1 \times 10^{18}$ carriers per centimeter cubed (cm$^3$).

34. The method of claim 21 wherein the semiconductor buffer layer is a lightly doped semiconductor buffer layer of the second doping type that is opposite the first doping type.

35. The method of claim 21 wherein the semiconductor base layer, the semiconductor buffer layer, and the one or more contact layers are formed of Silicon Carbide.

36. The method of claim 21 further comprising:
   forming a highly doped region in the semiconductor base layer that forms a second contact region of the electronic device.

37. The method of claim 36 wherein the plurality of layers further comprises one or more semiconductor layers on which the semiconductor base layer is formed, and a bottom surface of the one or more semiconductor layers forms a third contact region of the electronic device.

38. The method of claim 37 wherein the electronic device is a Gate Turn-Off Thyristor (GTO), and the first contact region is an anode of the GTO, the second contact region is a gate of the GTO, and the third contact region is a cathode of the GTO.

39. The method of claim 37 wherein the electronic device is a Bipolar Junction Transistor (BJT), and the first contact region is an emitter of the BJT, the second contact region is a base of the BJT, and the third contact region is a collector of the BJT.

40. The method of claim 21 wherein the electronic device is a MOS-Controlled Thyristor (MCT).

* * * * *